United States Patent [19]

Blum et al.

[11] Patent Number: 5,087,550

[45] Date of Patent: Feb. 11, 1992

[54] RADIATION-SENSITIVE MIXTURE AND USE THEREOF

[75] Inventors: Rainer Blum, Ludwigshafen; Gerd Rehmer, Beindersheim; Hans Schupp, Worms, all of Fed. Rep. of Germany

[73] Assignee: BASF Aktiengesellschaft, Ludwigshafen, Fed. Rep. of Germany

[21] Appl. No.: 412,461

[22] Filed: Sep. 26, 1989

[51] Int. Cl.$^5$ .................... G03F 7/008; G03F 7/038
[52] U.S. Cl. .................... 430/270; 430/283; 430/289; 430/286; 430/197; 430/921; 430/923; 430/916; 522/904; 522/905; 522/46; 522/164; 522/35; 522/37; 522/40; 522/43; 522/48; 522/60; 525/424
[58] Field of Search ............ 430/270, 283, 284, 286, 430/197; 525/424; 522/46, 164, 904, 905

[56] References Cited

U.S. PATENT DOCUMENTS

| | | | |
|---|---|---|---|
| 3,957,512 | 5/1976 | Kleeberg et al. | 96/35.1 |
| 4,272,607 | 6/1981 | Tsukada et al. | 430/288 |
| 4,287,294 | 9/1981 | Rubner et al. | 430/306 |
| 4,292,398 | 9/1981 | Rubner et al. | 430/306 |
| 4,311,785 | 1/1982 | Ahne et al. | 430/283 |
| 4,371,685 | 2/1983 | Ahne et al. | 528/73 |
| 4,385,165 | 5/1983 | Ahne et al. | 528/53 |
| 4,551,522 | 11/1985 | Fryd et al. | 528/351 |
| 4,558,117 | 12/1985 | Nakano et al. | 528/184 |
| 4,568,601 | 2/1986 | Araps et al. | 428/167 |
| 4,598,039 | 7/1986 | Fischer et al. | 430/323 |
| 4,610,947 | 9/1986 | Ahne | 430/296 |
| 4,629,777 | 12/1986 | Pfeifer | 528/353 |
| 4,654,415 | 3/1987 | Ahne et al. | 528/351 |
| 4,656,244 | 4/1987 | Ahne | 528/336 |
| 4,657,832 | 4/1987 | Pfeifer | 430/18 |
| 4,680,195 | 7/1987 | Pfeifer | 427/44 |
| 4,698,295 | 10/1987 | Pfeifer | 430/325 |
| 4,730,822 | 3/1988 | Wagner | 270/95 |
| 4,783,372 | 11/1988 | Pfeifer | 428/435 |
| 4,801,681 | 1/1989 | Ahne | 528/336 |

FOREIGN PATENT DOCUMENTS 2437360 2/1976 Fed. Rep. of Germany.

OTHER PUBLICATIONS

J. A. Joule et al., *Heterocycle Chemistry*, 2nd Ed., Van Nostrand Reinhold Company, Ltd., Molly Millars Lane, Wokingham, Berkshire, England, pp. 1-23.

*Chemical Abstracts*, "The Naming and Indexing of Chemical Compounds by Chemical Abstracts, (Introduction to 1945 Subject Index)", vol. 46, No. 24, Dec. 25, 1952, p. 5953, iso-.

*Primary Examiner*—Cynthia Hamilton
*Attorney, Agent, or Firm*—Keil & Weinkauf

[57] ABSTRACT

Radiation-reactive mixtures suitable for producing insulating layers and printed circuits are composed of certain precursors for preparing polyimides, polyisoindoloquinazolinediones, polyoxiazinediones, polyquinazolinediones or polyquinazolones and aryl-containing carbonyl compounds which when excited by UV radiation are capable of hydrogen abstraction, these mixtures undergoing solubility differentiation on irradiation with actinic light.

15 Claims, No Drawings

RADIATION-SENSITIVE MIXTURE AND USE THEREOF

The present invention relates to a radiation-sensitive mixture which contains an oligomeric or polymeric precursor for a polyimide, for a polyisoindoloquinazolinedione, for a polyoxazinedione, for a polyquinazolinedione, for a polyquinazolone or for a related polyheterocycle which in the presence of a suitable initiator is alterable in solubility by irradiation, preferably with UV rays, to the preparation thereof, and to the use thereof.

It is known to produce structured layers, in particular for the construction of electronic circuits, by first applying soluble, radiation-sensitive, preferably UV-sensitive, precursors (A) from solution to the substrate and drying them under mild conditions. The dried layer is then irradiated through a mask with radiation of a suitable wavelength to form a crosslinked intermediate stage (B) structured in accordance with the mask. The non-irradiated, i.e. unexposed, areas which still contain precursor (A) are washed out with suitable solvents. The structure formed by the remaining areas can finally be converted into the end function structure of stage (C) by application of high temperatures.

To prepare structures which, for example in the course of the fabrication or use of microelectronic circuits, are capable of withstanding high thermal and mechanical stresses, the preferred materials for functional stage (C) are the abovementioned heterocyclic, or aromatic-heterocyclic polymers.

The soluble precursors (A) for such polymers (C) have in general a polyamide-type-, structure such that there is adjacent to the amide group another group, in general a carboxyl, ester or ether group, which in the course of the high-temperature conversion into stage (C) will undergo a condensation reaction with the amide group.

There are two existing ways of rendering stage (A) polyamide-structures radiation-crosslinkable: 1. Direct, crosslinking with the polymer backbone by starting from benzophenone or benzophenone-like carbonyl compounds which will crosslink with the carbonyl group under UV light in the presence of suitable photoinitiators. Such systems are described for example in EP-A-0,134,752, EP-A-0,181,837, EP-A-0,162,017 and US-A-4,568,601. 2. Crosslinking via side chains with olefinically unsaturated groups and the preparation of precursors suitable for this purpose as described for example in DE-A-2,437,397, DE-A-2,437,348, DE-A-2,437,413, DE-A-2,437,369, DE-A-2,919,840, DE-A-2,919,841, DE-A-2,933,286 and DE-A-2,308,830.

Precursors of the type mentioned, which are soluble in organic solvents, are described for example in DE-C-2,308,830. These polymeric precursors are polyaddition or polycondensation products of polyfunctional carbocyclic or heterocyclic compounds which carry radiation-sensitive radicals with diamines, diisocyanates, bisacid chlorides or dicarboxylic acids. The compounds which carry radiation-sensitive radicals contain two carboxyl, chlorocarbonyl, amino, isocyanate or hydroxyl groups suitable for addition or condensation reactions and, partly in ortho or para position to the first groups, ethylenically unsaturated groups bonded in ester fashion to carboxyl groups. The diamines, diisocyanates, bisacid chlorides and dicarboxylic acids to be reacted with these compounds have at least one cyclic structural element.

Radiation-reactive polyimide precursors specifically are prepared by adding unsaturated alcohols, such as allyl alcohol, to tetracarboxylic dianhydrides, such as pyromellitic dianhydride, converting the free carboxyl groups of the resulting diesters into acid chloride groups, and subjecting the resulting diester bisacid chlorides to a polycondensation reaction with a diamine, which is usually aromatic, such as diaminodiphenyl ether. If diamino compounds having ortho-disposed amido groups are used, polyisoindoloquinazolinediones are formed in a similar manner.

Polyoxazinedione precursors are formed by polyaddition of diisocyanates, such as diphenylmethane diisocyanate to phenolic hydroxyl groups of olefinically unsaturated diesters, such as methylene disalicylic esters, and, similarly, polyquinazolinediones are formed by polyaddition of diisocyanates to amino groups of olefinically unsaturated diesters.

Existing methods of preparation generally involve multiple reaction stages and require low temperatures. In addition, if acid chlorides are used, thorough purification of the reaction products is necessary; that is, the synthesis of unsaturated diesters of the type mentioned is difficult to carry out.

DE-A-2,933,826 indicates a way of circumventing some of these difficulties by adding unsaturated epoxides to carboxyl-containing precursors. The disadvantage here is that carboxyl groups react with epoxy groups at a satisfactory rate only at elevated temperature and in the presence of catalysts. As a consequence, the products formed are frequently insoluble, for example as a result of partial imidation, or incipiently crosslinked.

The disadvantages of this method are thus the difficulties in the formation of stages (A) due to the unsaturated character of the starting materials and the end products.

For instance, only relatively low temperatures may be used, which results in long reaction times and poor conversions. Furthermore, it is nonetheless necessary in some instances to add polymerization inhibitors, which must later be removed in complicated purification operations in order to obtain a high light sensitivity, or speed, in use.

Another disadvantage becomes evident in storing and processing the unsaturated stages (A), which because of the dangers of oxidation and polymerization must take place under inert gas and with cooling.

It is an object of the present invention to provide an oligomeric or polymeric precursor for a polyimide, for a polyisoindoloquinazolinedione, for a polyoxazinedione, for a polyquinazolinedione, for a polyquinazolone or for a related polyheterocycle, which is soluble in an organic solvent, which is radiation-reactive, which is easy to prepare and which is storable and processible without special precautions such as inert gas and cooling.

We have found, surprisingly, that this object is achieved by introducing a radical, hereinafter referred to and defined in more detail as $R^1$, which is free of double bonds and capable of the ready release of hydrogen, into a precursor (A) and using a certain carbonyl compound.

In the precursor (A) the radical $R^1$ is in a suitable position relative to an amide group as to be capable of undergoing a condensation reaction therewith at elevated temperature to form the highly heat-resistant substance of stage (C).

The present invention accordingly provides a radiation-sensitive mixture which is suitable for preparing a polyimide, a polyisoindoloquinazolinedione, a polyoxazinedione, a polyquinazolinedione or a polyquinazolone and which on irradiation with actinic light undergoes solubility differentiation, consisting of (a) one or more precursors having structural elements of the general formula (I)

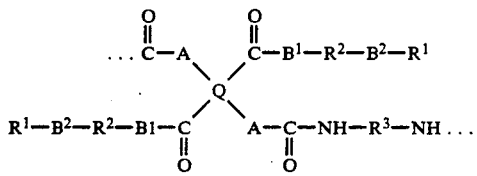

where
A is —O—, —NH— or a single bond,
Q is an aromatic or heterocyclic tetravalent radical, or a radical which contains two bivalent aromatic radicals linked by a bridging group, wherein two at a time of the valences are adjacent to each other,
$B^1$ is —O— or —$NR^4$—,
$B^2$ is —NH—CO—NH—, —NH—CO—O—, —NH—CO— or a single bond,
$R^1$ is a readily hydrogen-donating radical,
$R^2$ is a bivalent aliphatic or aromatic radical or a single bond,
$R^3$ is a bivalent aliphatic, cycloaliphatic, aromatic or heterocyclic radical which may be halogen-substituted and
$R^4$ is H or straight-chain or branched alkyl which may be halogen-substituted,
with the proviso that the readily hydrogen-donating radical $R^1$ is a radical selected from the group consisting of isoalkyls, aminoisoalkyls, cycloisoalkyls, cycloisoalkyls having one or more hetero atoms, and groups of the following general formulae:

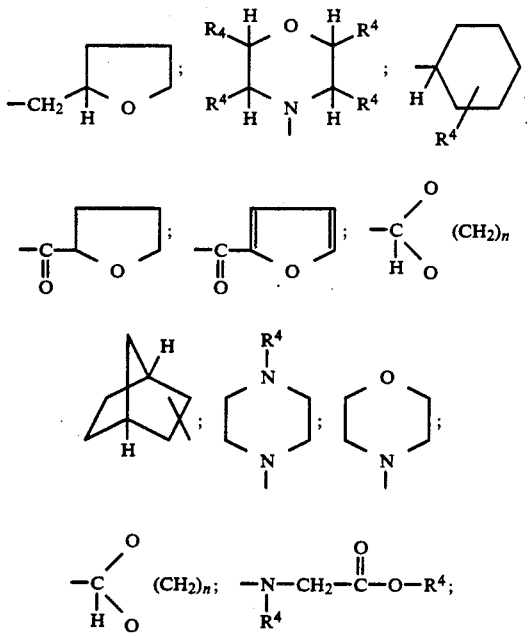

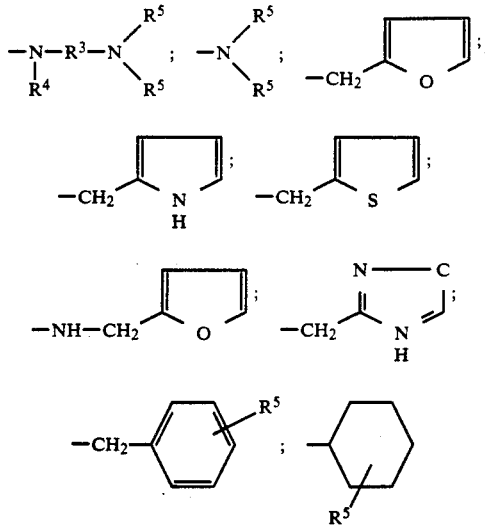

where
n=2 or 3 and
$R^5$ is alkyl, aryl, halogen-substituted alkyl or halogen- or otherwise-substituted aryl, (b) one or more aryl-containing carbonyl compounds which when excited by UV radiation are capable of hydrogen abstraction, and optionally (c) one or more substances selected from the group consisting of a photoinitiator, a photosensitizer, a (leuco)dye and an aliphatic ketone.

A suitable aryl-containing carbonyl compound (b) is selectable in particular from the group consisting of benzophenone, xanthone, thioxanthone, fluorenone, benzil, acenaphthenequinone, tetralone, benzylideneacetone, dibenzylideneacetophenone, benzoin, benzoin ether, benzanilide, acetophenone, propiophenone, naphthoquinone, anthraquinone, anthrone and the carbonyl compounds derived from these basic structures by halogenation or alkylation.

Similarly, the carbonyl compound (b) can be benzophenone or a benzophenone derivative, alone or mixed with 2-, 3- or 4-hydroxybenzophenone, benzophenone-2-carboxylic acid, benzophenone-3-carboxylic acid, benzophenone-4-carboxylic acid, 3,3',4,4'-benzophenonetetracarboxylic acid or anhydride, 3,3',4,4'-tetra(tert.butylperoxycarbonyl)benzophenone, 2-, 3- or 4-phenylbenzophenone, 2-, 3- or 4-alkylbenzophenones having from 1 to 10 carbon atoms in the alkyl radical or halogenated (monoalkyl)benzophenones, such as 4-(trifluoromethyl)benzophenone, and also heteroceriumdianthrone and its endoperoxide, or ketones such as 2-acetonaphthone, 4-aminobenzophenone, Michler's ketone and the salts of these amines and optionally also aliphatic ketones such as acetone, methylisobutyl ketone or isoamyl ketone and copolymers of carbon monoxide with ethylene.

The radiation-sensitive mixture according to the invention contains a carbonyl compound (b) in general in an amount of from 0.001 to 200, preferably from 1 to 10,% by weight, based on the radiation-sensitive precursor (a).

In the radiation-sensitive mixture according to the invention, the carbonyl compound (b) can be used in a solid, dissolved, dispersed or molten, monomeric or polymeric form; furthermore, to improve the speed and to match the absorption to a source of UV rays, a non-carbonylic photoinitiator, photosensitizer and/or certain (leuco) dyes may additionally be added.

To form the precursor (a), which may be used in a monomeric, oligomeric or polymeric form or in the form of a mixture of different polymerization stages, carboxyl-containing polyaddition products of aromatic and/or heterocyclic tetracarboxylic anhydrides and diamino compounds may be linked at the carboxyl groups to radicals $R^1$ via an ester, ether, amide or urethane group or carboxyl-containing polyaddition products of aromatic and/or heterocyclic dihydroxydicarboxylic acids and diisocyanates may be linked at the carboxyl groups to radicals $R^1$ via an ester, ether, amide or urethane group, or carboxyl-containing polyaddition products of aromatic and/or heterocyclic diaminodicarboxylic acids and diisocyanates may be linked at the carboxyl groups to radicals $R^1$ via an ester, ether, amide or urethane group.

The present invention also provides a process for preparing a radiation-sensitive mixture according to the invention, which comprises introducing a radical $R^1$ into a precursor (a) by reacting a carboxyl-containing polyaddition product of an aromatic or heterocyclic diaminocicarboxylic acid and a diisocyanate, or a carboxyl-containing polyaddition product of an aromatic or heteterocyclic dihydroxydicarboxylic acid and diisocyanate, or a carboxyl-containing polyaddition product of an aromatic or heterocylic tetracarboxylic anhydride and a diamino compound with a mono adduct of a diisocyanate and a compound of the structure $R^1$—OH, $R^1$—HN$_2$, $R^1$—(B$^2$)—NH$_2$ or $R^1$—COOH.

In a preferred way of preparing a precursor (a), a radical $R^1$ is introduced into the carboxyl-containing polyaddition product of an aromatic or heterocyclic diaminodicarboxylic acid and diisocyanate or into the carboxyl-containing polyaddition product of an aromatic or heterocyclic dihydroxydicarboxylic acid and diisocyanate or into the carboxyl-containing polyaddition product of an aromatic or heterocyclic tetracarboxylic anhydride and diamino compound in such an amount that the ratio of $R^1$ to carboxyl in the carboxyl-containing polyaddition product is from 1:1 to 0.05:1.

In this reaction, the preferred tetracarboxylic anhydride is pyromellitic anhydride or benzophenonetetracarboxylic anhydride, the preferred dihydroxydicarboxylic acid if 4,4'-dihydroxydiphenylmethane-3,3'-dicarboxylic acid and the preferred diaminodicarboxylic acid is 4,4'-diaminodiphenylmethane-3,3'-dicarboxylic acid.

The radiation-sensitive mixture according to the invention may as well as the groups present therein, which are crosslinkable via $R^1$, contain further radiation-sensitive radicals, in particular radicals having ethylenic double bonds and/or other radicals which crosslink with bisazides.

The radiation-sensitive mixture according to the invention may also be used mixed with other radiation-sensitive substances and/or non-radiation-sensitive substances.

The present invention also provides a method of using the radiation-sensitive mixture according to the invention for paints, embedding materials and coating agents and for producing protective and insulating layers for use in the construction of printed and integrated circuits by subjecting it to radiative crosslinking and/or thermal aftertreatment, or by exposing it through a mask and thereby partially crosslinking it, then structuring it with suitable solvents and then if necessary subjecting it to a thermal aftertreatment.

The precursor (A) to be used according to the invention is soluble in organic, in particular polar, solvents such as formamide, acetamide, N-methylformamide, N,N-dimethylformamide,N-methylpyrrolidone,N,N-dimethylacetamide, butyrolactone, caprolactam, hexamethylphosphoramide or mixtures thereof, easy to prepare and storable and processible without special precautions and without loss of radiation reactivity.

The radiation-sensitive mixture according to the invention, i.e. the mixture of (a) the precursor (A) and the carbonyl compounds (b) which when excited by UV radiation are capable of hydrogen abstraction, is notable in particular for the formation of crisp contours on photostructuring and for good sustained heat resistance of the end function structure.

There now follow specifics concerning the formative components of the precursor (A) to be used according to the invention and the radiation-sensitive mixture.

The precursor (a) according to the invention preferably contains or consists of groups of the general formula (I)

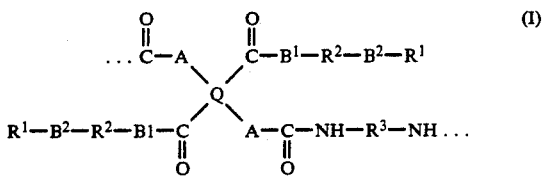

where

A is —O—, —NH— or a single bond,

Q is an unsubstituted or halogen-substituted at least partly aromatic or heterocyclic tetravalent, i.e. tetrafunctional radical wherein two valences at a time are adjacent to each other, or is a radical which contains two bivalent aromatic radicals bonded to each other via a bridging group Y (cf. below), ie. in total a tetravalent radical wherein two valences at a time are adjacent to each other; if the radical Q has a plurality of aromatic and/or heterocyclic structural elements, the valence pairs are each located on terminal structural elements of this type;

$B^1$ is —O— or —NR$^4$—, preferably —NH— or a bivalent such as —S— or —SO$_2$—;

$B^2$ is —NH—CO—NH—, —NH—CO—O—, —NH—CO— or a single bond, $R^2$ is a bivalent aliphatic or aromatic radical, e.g. hexamethylene, ethylene, phenylene or toluylene, or a single bond, $R^3$ is a bivalent aliphatic, cycloaliphatic, aromatic or heterocyclic radical, for example biphenylene, phenylene,methyldicyclohexylene,methylbiphenylene, oxydiphenylene or tetraisopropylox-ydiphenylene, which may each also be halogen-substituted, $R^1$ is a readily hydrogen-donating radical from the group consisting of isoalkyls of from 3 to 15 carbon atoms, e.g. isopropyl, isobutyl or ethylhexyl, aminoisoalkyls of from 3 to 15 carbon atoms, e.g. diisopropylaminoethyl, isopropylaminoalkyl, N-isobutyl- or N-isopropylaminoalkyl, cycloisoalkyls of from 6 to 15 carbon atoms, e.g. methylcyclohexyl or cycloisoalkyls which contain one or more hetero atoms, or isoalky, aminoisoalkyl- or cycloisoalkyl- substituted aryl e.g. furfuryl, tetrahydrofurfuryl, benzyl, cumyl, p-menthyl, terpinyl or thymolyl, and groups of the following formulae:

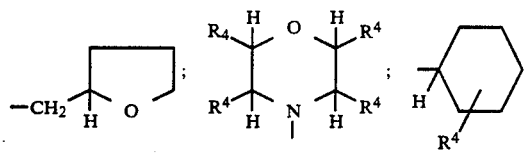

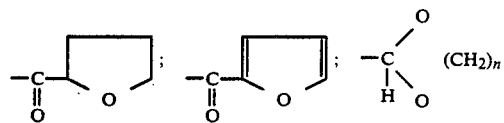

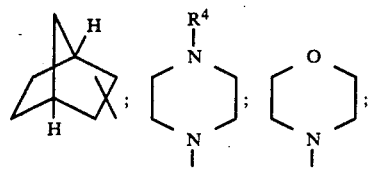

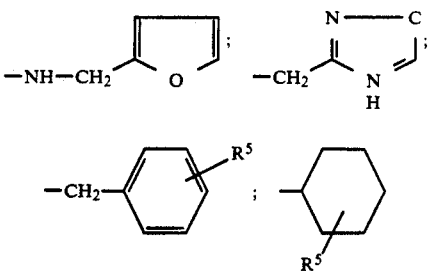

where
n is 2 or 3,
R$^4$ is H, straight-chain alkyl of from 1 to 15 carbon atoms, branched alkyl of from 3 to 15 carbon atoms, halogen-substituted, e.g. Cl—, F— or Br—substituted, straight-chain or branched alkyl, e.g. —C(CF$_3$) or isopropyl and
R$^5$ is alkyl of from 1 to 15 carbon atoms, e.g. isopropyl, isobutyl or isoamyl, aryl, e.g. isoamylphenyl, halogen-substituted, e.g. Cl—, F— or Br-13 substituted alkyl, of from 1 to 15 carbon atoms, halogen-substituted, e.g. Cl—, F— or Br—substituted, aryl.

Examples of a precursor (a) of the general formula (I) are:

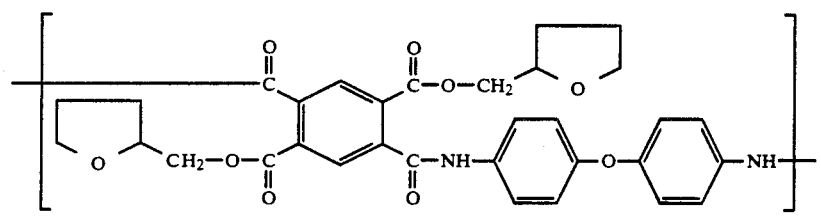

Formula (I/1)

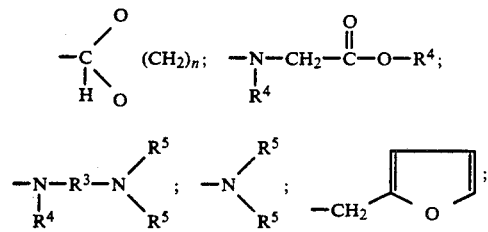

Q: Pyromellitic acid radical,
R$^3$: Diaminodiphenyl oxide radical,
R$^1$: —O—,
R$^2$: Single bond,
B$^2$: Single bond,
R$^1$: Tetrahydrofurfuryl radical,
A: Single bond,

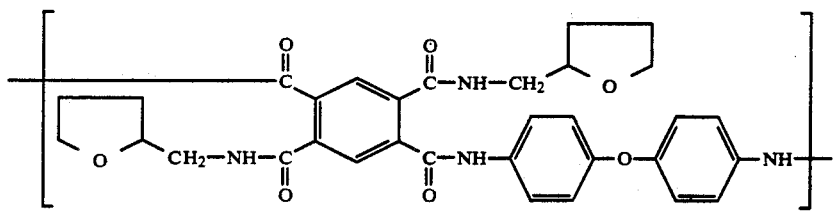

Formula (I/2)

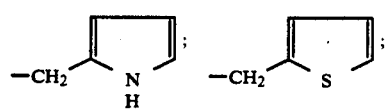

Q: Pyromellitic acid radical,
R$^3$: Diaminodiphenyl oxide radical,
B$^1$: —NH—
R$^2$: Single bond,
B$^2$: Single bond,
R$^1$: Tetrahydrofurfuryl radical,
A: Single bond

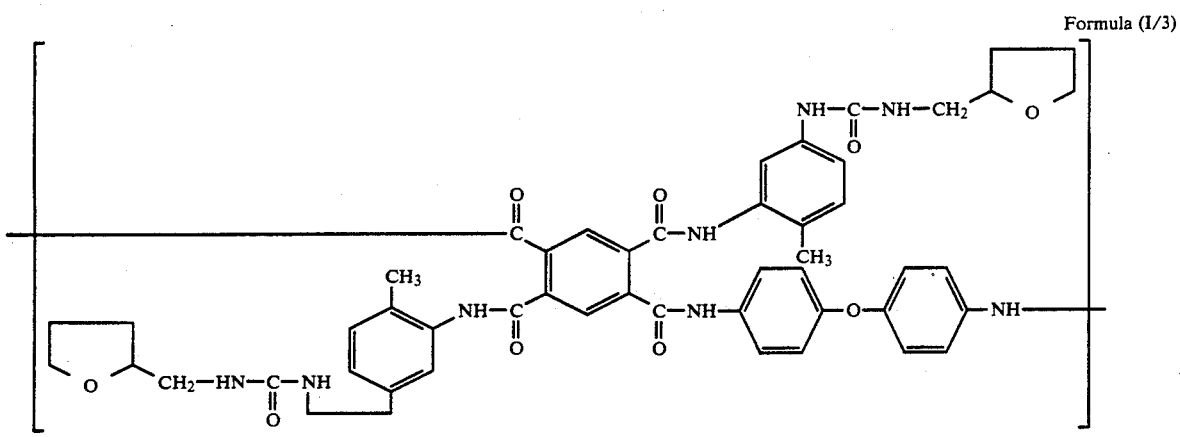

Formula (I/3)

Q: Pyromellitic acid radical,
R³: Diaminodiphenyl oxide radical,

R¹: Tetrahydrofurfuryl radical,
A: Single bond,

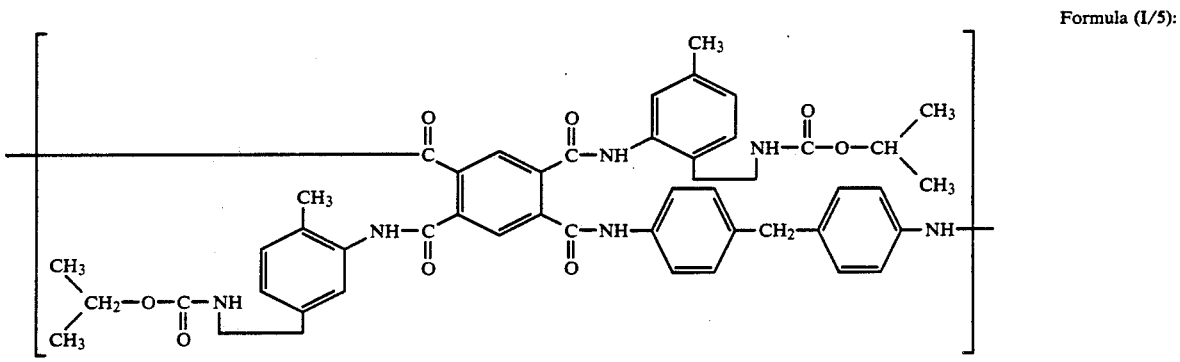

Formula (I/5):

B¹: —NH—,
R²: Toluylene,
B²: —NH—CO—NH—,
R¹: Tetrahydrofurfuryl radical,
A: Single bond, Q: Pyromellitic acid radical,
R³: Diaminodiphenylmethane radical,
B¹: —NH—,
R²: Toluylene,
B²: —NH—CO—O—,

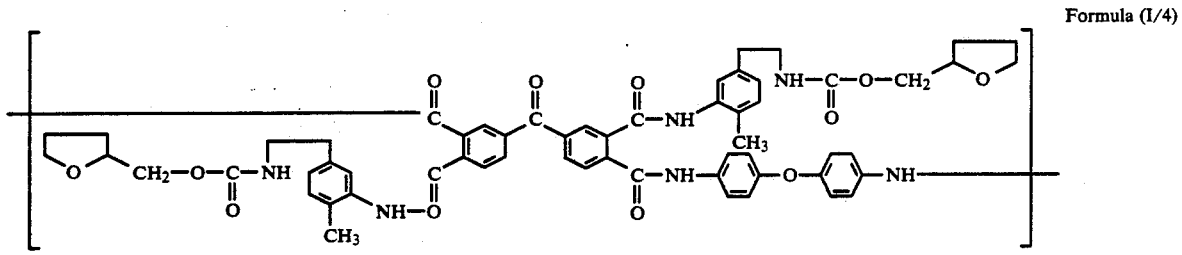

Formula (I/4)

Q: Benzophenonetetracarboxylic acid radical,
R³: diaminodiphenyl oxide radical,
B¹: —NH—,
R²: Toluylene,
B²: —NH—CO—O—, R¹: Isopropyl radical,
A: Single bond.

Precursors (a) of the formulae (I/1) to (I/5) lead on treatment at higher temperatures, in general ≧150° C., to polyimides as substances of stage (C).

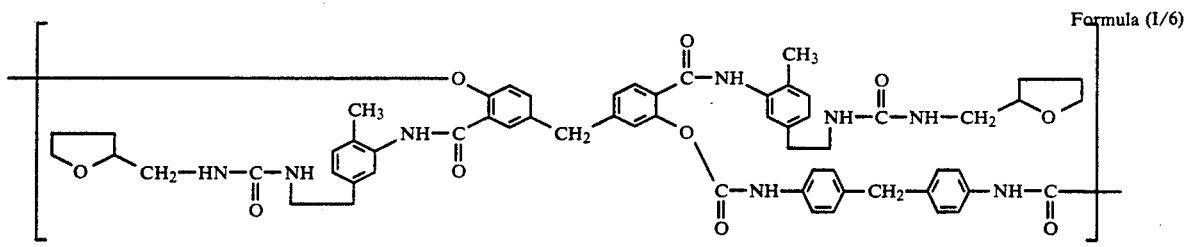

Formula (I/6)

Q: 3,3'-Dicarboxy-4,4'-dihydroxydiphenylmetane radical, without wishing to restrict the claimed structures to those having these structural members.

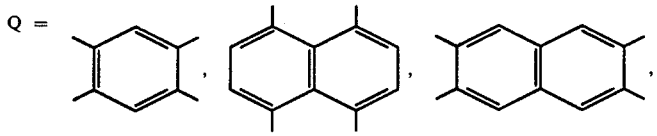

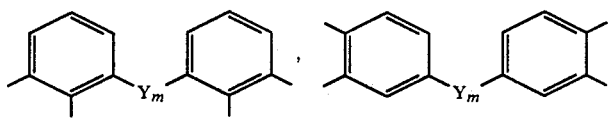

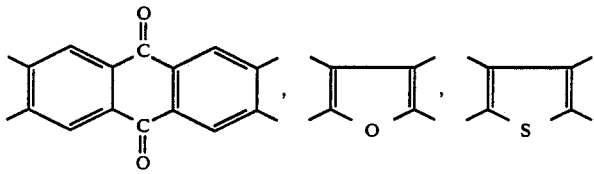

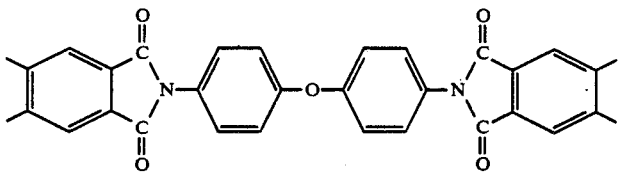

where
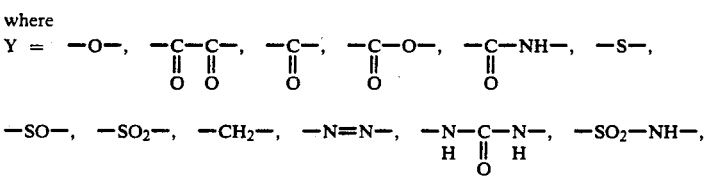

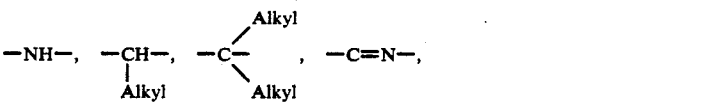

$R^3$: based on 4,4'-Diisocyanatodiphenylmethane radical,
$B^1$: —NH—,
$R^2$: Toluylene,
$B^2$: —NH—CO—NH—,
$R^1$: Tetrahydrofurfuryl radical,
AL —O—

Precursors (a) of the formula (I/6) form on treatment at higher temperatures, in general ≧150° C., polybenzoxazinediones as substances of stage (C).

The precursors (a) of the formula (I/1) to (I/6) may have for example degrees of polymerization of from 2 to 200.

The tetravalent radical Q in the general formula (I) may be for example on the of the following radicals m=0 or 1;
Alkyl=alkyl of from 1 to 15 carbon atoms.

The methods for forming the oligpmeric or polymeric precursor (a) according to the invention are conventional in principle.

Basically, there are two ways for forming the prior art precursors (a):

1. Introduction of the light-sensitive group into the monomer units, followed by synthesis of the higher molecular weight precursors.

A typical example of this way is indicated in DE-A-2,437,397, namely addition of allyl alcohol to pyromellitic anhydride, reaction of the monoester formed with thionyl chloride to give the acid chloride, and polymerization thereof with diamines.

Further prior art documents which describe methods of synthesis starting from unsaturated monomeric units are for example DE-A-2,437,369, DE-A-2,437,413, DE-A-2,919,840, DE-A-2,919,841, DE-A-3,411,660, DE-A-3,411,697, DE-A-3,411,706, DE-A-3,411,714, US-A-4,55,522 and US-A-4,558,117.

2. Another way of introducing light-sensitive unsaturated groups consists of first forming polymeric or oligomeric products without light-sensitive groups and then introducing light-sensitive groups into them.

A typical example of this way is described for example in DE-A-2,933,826: pyromellitic anhydride and diaminodiphenyl oxide are added together in dimethylacetamide as solvent to form a polyamide which contains carboxyl groups. These carboxyl groups are then reacted with glycidyl methacrylate to introduce double bonds, thereby forming preliminary products which are UV-crosslinkable in the presence of photoinitiators.

Further prior art documents which describe the subsequent introduction of light-sensitive groups into polymeric preliminary products are for example DE-A-2,933,827 and DE-A-3,021,748.

According to the invention, polymeric and/or oligomeric precursors (a) for polyimides, polyisoindoloquinazolinediones, polyoxazinediones, polyquinazolinediones and related polyheterocycles are made accessible to radiative crosslinking by introducing into them in a conventional manner radicals R: which act as light-sensitive groups.

The precursors (a) according to the invention which carry light-sensitive radicals $R^1$, are used in combination with carbonyl compounds which when excited by UV light are capable of hydrogen abstraction.

Light-sensitive radicals $R^1$ for the purposes of the present invention are those which have a readily abstractable hydrogen atom and can be aliphatic, heterocycloaliphatic, aromatic or aliphatic/aromatic and may have hetero atoms as mentioned above.

Precursors (a), i.e. polymers or oligomers with carboxyl-containing radicals $R^1$, are prepared by starting in general from polycarboxylic acids and/or polycarboxylic anhydrides, polyhydroxypolycarboxylic acids, polyaminopolycarboxylic acids, preferably from tetracarboxylic acids or tetracarboxylic dianhydrides, which form the radical Q in the formula (I).

Derived from this radical Q, the end products (C) preferably have the following structural units:

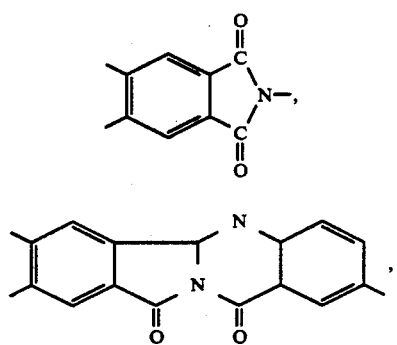

-continued

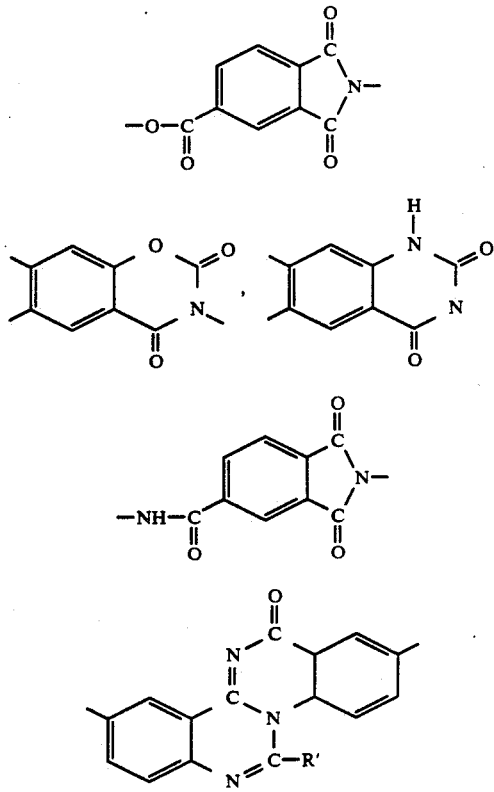

where, $R'$ is alkyl of from 1 to 6 carbon atoms or H.

Examples of polycarboxylic acids via which the radical Q can be introduced into the formula (I) are the following acids and anhydrides thereof: 2,3,9,10-perylenetetracarboxylic acid, 1,4,5,8-naphthalenetetracarboxylic acid, 2,6-dichloronaphthalene-1,4,5,8-tetracarboxylic acid, 2,7-dichloronaphthalene-1,4,5,8-tetracarboxylic acid, phenanthrene-1,8,9,10-tetracarboxylic acid, trimellitic acid, 3,3',4,4'-biphenyltetracarboxylic acid,2,2',4,4'-biphenyltetracarboxylic acid, 4,4'-isopropylidenediphthalic acid, 3,3'-propylidenediphthalic acid, 4,4'-oxydiphthalic acid, 4,4'-sulfonyldiphthalic acid, 3,3'-oxydiphthalic acid, dicarboxydihydroxdiphenylmethane isomers, diaminodicarboxydiphenylmethane isomers, dicarboxyd-ihyiroxyphenyl oxide isomers, diaminodicarboxydiphenyl oxide isomers, dicarboxydihydroxdiphenyl sulfone isomers, diaminodicarboxydiphenyl sulfoxide isomers, 4,4'-methylenediphthalic acid, 4,4'-thiodiphthalic acid, 4,4'-acetylidenediphthalic acid, 2,3,6,7-naphthalenetetracarboxylic acid, 1,2,4,5-naphthalenetetracarboxylicacid,1,2,3,5-naphthalenetetracarboxylic acid,benzene-1,2,3,4-tetracarboxylic acid, thiophene-2,3,4,5-tetracarboxylic acid, 1-(3',4'-dicarboxyphenyl)- 1,3,3-trimethylindane-5,6-dicarboxylic acid, 1-(3,,4,-dicarboxyphenyl)-1,3,3-trimethylindane-6,7-dicarboxylic acid, pyrazine-2,3,5,6-tetracarboxylic acid, tetrahydrofurantetracarboxylic acid, benzophenonetetracarboxylic acid and also substitution products of these polycarboxylic acids, in particular halogen and/or alkyl substitution products.

To introduce the radicals $R^3$ into the preliminary products (a), the starting materials are in general diamines or diisocyanates.

Suitable diamines are for example 4,4'-diaminodiphenyl ether, 4,4'-methylenebis(o-chloroaniline), 3,3'-dichlorobenzidine, 3,3'-sulfonyldianiline, 4,4'-diaminobenzophenone,1,5-diaminonaphthalene,bis(4-aminophenyl)-dimethylsilane, bis(4-aminophenyl)diethylsilane, bis(4-aminophenyl)diphenylsilane, bis(4-aminophenyloxy)-dimethylsilane, bis(4-aminophenyl)ethylphosphine oxide, N-(bis(4-aminophenyl))-N-methylamine, N-(bis(4-aminophenyl))-N-phenylamine, 4,4'-methylenebis(3-methylaniline), 4,4'-methylenebis(2-ethylaniline), 4,4'-methylenebis(2-methoxyaniline), 5,5'-methylenebis(2-aminophenol), 4,4'-methylenebis(2-methylaniline), 5,5'-oxybis(2-aminophenol), 4,4'-thiobis(2-methylaniline), 4,4'-thiobis(2-methoxyaniline), 4,4'-thiobis(2-chloroaniline), 4,4'sulfonylbis(2-ethoxyaniline), 4,4'-sulfonylbis(2-chloroaniline),5,5'-sulfonylbis(2-aminophenol),3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, p-phenylenediamine, 4,4'-methylenedianiline, 4,4'-oxydianiline, 4,4'-thiodianiline, 4,4'-sulfonyldianiline, 4,4'-isopropylidenedianiline, 3,3'-dimethylbenzidine, 3,3'-dimethoxybenzidine, 3,3'-dicarboxyb-enzidine and diaminotoluene.

The term "diamine" here should also encompas compounds which contain the structure element

i.e. derivatives of hydrazine.

Suitable diisocyanates are for example toluylene diisocyanate, isophorone diisocyanate, diisocyanatodiphenylmethane, trimethylhexamethylene diisocyanate, hexamethylene diisocyanate, dicyclohexylmethane diisocyanate and the dimers of these isocyanates formed via uretdione groups, and also monomeric, oligomeric and/or polymeric diisocyanates obtained from the reaction of the compounds which are bifunctional toward isocyanate groups, e.g. diamines or diols, with diisocyanates.

The starting materials mentioned are known or can be prepared in a manner known per se.

Preference is given to forming those precursors (a) which on conversion into the final state (C) show high heat resistance.

The polymeric precursors (a) are in general advantageously prepared in suitable organic solvents, i.e. in particular in formamide, acetamide, N-methylformamide, N,N-dimethylformamide,N-methylpyrrolidone,N,N-dimethylacetamide, butyrolactone, caprolactam, hexamethylphosphoramide and the like.

The precursors (a) according to the invention can be prepared by the method described above under 1 for the introduction of double bonds or preferably by the method described under 2. In the preparation, aromatic and/or heterocyclic tetracarboxylic anhydrides are reacted with diamino compounds and/or diamino compounds having at least one ortho-disposed amido group or aromatic and/or heterocyclic dihydroxydicarboxylic acids and/or diaminodicarboxylic acids with diisocyanates to give carboxyl-containing polyaddition products.

Into these carboxyl-containing polyaddition products the radicals $R^1$, which are light-sensitive if combined with certain carbonyl compounds, are introduced by linking radicals $R^1$ to amine or hydroxyl groups via amide or ester groups in a conventional manner of organic chemistry.

It is also possible to react such radicals $R^1$ as carry epoxy or isocyanate groups with the carboxyl-containing polyaddition products to give the precursors (a) according to the invention.

Suitable carbonyl compounds (h) which when excited by UV radiation are capable of hydrogen abstraction are preferably aromatic ketones, such as benzophenone, xanthone, thioxanthone, fluorenone, benzil, acenaphthenequinone, tetralone, benzylideneacetone, dibenzylidene, benzoin, benzoin ethers, naphthoquinone, anthraquinone, anthrone and the carbonyl compounds derived from these basic structures, for example by halogenation or alkylation, and also aromatic/aliphatic ketones such as acetophenone and propiophenone.

Particular preference is given to benzophenone and benzophenone derivatives, alone or mixed, eg. 2-, 3- or 4-hydroxyben-zophenone, benzophenone-2-carboxylic acid, benzophenone-3-carboxylicacid,benzophenone-4-carboxylic acid, 3,3',4,4'-benzophenonetetracarboxylic acid and anhydride, 3,3',4,4'-tetra(tert.-butylperoxycarbonyl)-benzophenone, 2-, 3- or 4-phenylbenzophenone, 2-, 3- or 4-alkylbenzophenones having from 1 to 10 carbon atoms in the alkyl radical, halogenated (monoalkyl)benzophenones, such as 4-(trifluoromethyl)benzophenone. It is also possible to use heteroceriumdianthrone and its endoperoxide. Further possibilities are ketones such as 2-acetonaphthone, 4-aminobenzophenone and 4,4'-tetramethylaminobenzophenone and the salts of these amines. It is also possible to use aliphatic ketones such as acetone, methyl isobutyl ketone, isoamyl ketone and copolymers of carbon monoxide with ethylene.

Mixtures of such carbonyl compounds can also be used with advantage.

The carbonyl compound (b) is generally used in amounts of from 0.001 to 200, preferably from 1 to 10% by weight, based on the precursor (a). The carbonyl compounds can be used in a solid, dissolved, dispersed or molten, monomeric and/or polymeric form.

The amount of carbonyl compound best used is determined inter alia by the desired thickness of add-on, the degree of polymerization of precursor (a), the chemical structure of precursor (a) and the spectrum of the source of UV rays used.

It is also possible, for example, to improve the speed and/or to adapt the absorption to a source of UV rays to add non-carbonylic photoinitiators, sensitizers and/or certain dyes or leuco dyes.

The choice of suitable further sensitizers, photoinitiators and/or dyes is made in a conventional manner. Further customary auxiliaries and additives, in particular flow improvers and adhesion promoters, can likewise be added.

The most important use of the product according to the invention is as a photoresist by exposing through a mask, structuring with suitable solvents and then converting the structured layers at elevated temperatures into the end function layer (C).

However, there are also possibilities for use as insulating and protective layers in electrical engineering, electronics and microelectronics by using the substance according to the invention in stages (B) and (C).

The substance according to the invention can also be used with advantage as a coating on optical fibers.

The invention will be further illustrated with reference to Examples.

In the Examples, parts and percentages are by weight, unless otherwise stated.

1. Preparation of a carboxyl-containing polyaddition product:

09 parts of pyromellitic anhydride (0.5 mole) and 486 parts of N-methylpyrrolidone are dissolved at 60° C. under very pure nitrogen by stirring in a reaction flask which is pressure-equilibrated through a U-tube packed with drying agent.

A solution of 100 parts of diaminodiphenyl oxide (0.5 mole) in 350 parts of N-methylpyrrolidone is added through a dropping funnel in the course of an hour during which the temperature rises to 66° C. The resin solution is stirred at 75° C. for one hour and then cooled, and turns viscous.

| | |
|---|---|
| Acid number (AN) | 53.2; |
| Viscosity: | 5750 mPas at D = 100 l/s |
| IR spectrum | typical amide band combination at 1720, 1663, 1543, 1500 and 1240 l/cm. |

2. Preparation of an isocyanate having radicals $R^1$ 174 parts of 2,4-toluylene diisocyanate (1 mole=2 equivalents) are admixed by stirring with a solution of 72 parts of tetrahydrofurfuryl alcohol (1 mole=1 equivalent)

0.1 part of dibutyltin dilaurate 0.1 part of benzoyl chloride in 127 parts of n-butyl acetate ( added dropwise in the course of two hours during which the temperature rises from. 23° C. to 39° C. Stirring is subsequently continued at 35° C. for two hours. The result is a low-viscosity liquid having an NCO content of 10.8%.

EXAMPLE 1

200 parts of the $CO_2H$-containing polyaddition product (cf. 1) and 0.3 part of dimethylaminopyridine rapidly admixed with 76 parts of the isocyanate having radicals $R^1$ (cf. 2) by stirring in a glass flask with an attached bubble counter. A gas begins to evolve. Gas evolution ceases after about two hours. Stirring is then continued at 60° C. for two hours during which gas evolution initially increases again and then ceases. This resin solution is tested with and without the addition of 2% of benzophenone (cf. Table).

EXAMPLE 2

218 parts of pyromellitic anhydride (1 mole) are stirred together with stoichiometric excess, namely 900 parts of tetrahydrofurfuryl alcohol and 1 part of triethylenediamine at 65° C. for 5 hours in a stirred flask. The excess tetrahydrofurfuryl alcohol is then largely distilled off under reduced pressure. The residue, judging by its weight (365 g) and acid number (314), is ditetrahydrofurfuryl pyromellitate. This residue is then admixed in the absence of water with 600 parts of thionyl chloride added with stirring over an hour, during which the temperature rises to 38° C. After 2 hours the contents are heated at 60° C. for 4 hours, and excess thionyl chloride is distilled off under reduced pressure. The residue is admixed with 100 parts of dimethyl acetamide, followed under ice-cooling by a solution of 200 parts of 4,4'-diaminodiphenyl oxide in 600 parts of dimethyl acetamide added at 22-27° C. in the course of 2 hours, and the contents are subsequently stirred at 40° C. for 2 hours. The result is a low-viscosity brown resin solution. It is added with vigorous stirring to a mixture of equal parts of propanol/acetone/water. A brownish dispersion forms, from which a brown resin precipitates after 48 hours. The supernatant, still cloudy dispersion is discarded, and the residue is stirred up twice with fresh coagulating solvent, which after stirring for several hours yields dispersions over resin sediment.

The dispersion layars are discarded, leaving 184 parts of a brown, viscous resin, which is dissolved in 184 parts of N-methylpyrrolidone and stored in that form over molecular sieve to remove residual moisture The resin solution is tested with and without the addition of 2% of benzophenone (cf. Table).

EXAMPLE 3

200 parts of carboxy-containing polyaddition product (cf. 1) are admixed in a stirred flask with a solution of 18.6 parts of tetrahydrofurfurylamine in 43.4 parts of N-methylpyrrolidone over 15 minutes during which the temperature rises to 34° C. A solution of 39.6 parts of dicyclohexylcarbodiimide in 92.4 parts of N-methylpyrrolidone is added over 30 minutes during which the temperature rises to 38° C. and a precipitate forms.

The contents are subsequently stirred at 60° C. for an hour, cooled and filtered to remove the precipitate.

The result is a brownish resin solution having a viscosity of 870 mPas at D=100. This resin solution is tested with and without the addition of 2% of benzophenone (cf. Table). Testing of products of the Examples and the Comparative Example.

Resin solutions of the $CO_2H$-containing polyaddition product and Examples 1 to 3 are knife-coated as such and with 2% of benzophenone, based on the resin content, on glass plates and dried at 50° C. under reduced pressure in the course of 3 hours. Tack-free slightly brown films of 25-30 lm are obtained. These films are half covered with aluminum foil and exposed under a high-pressure mercury lamp for 15 minutes and then tested with a 1:1 mixture of ethanol/N-methylpyrrolidone as to differences in the solubility between irradiated and covered areas.

The test results are shown in the following Table:

| | | Solubility | |
|---|---|---|---|
| Resin | Benzophenone | unirradiated | irradiated |
| $CO_2H$-containing polyaddition product (cf. 1) | — | soluble | soluble |
| | + | soluble | soluble |
| Example 1 | — | soluble | soluble |
| | + | soluble | insoluble |
| Example 2 | — | soluble | soluble |
| | + | soluble | insoluble |
| Example 3 | — | soluble | soluble |
| | + | soluble | insoluble | soluble means: can be removed by gentle rubbing with a solvent-soaked wad of absorbent cotton.
insoluble means: only removable, if at all, with a solvent-soaked wad of absorbent cotton as a crumbly crosslinked resin following prolonged intensive rubbing.

We claim:

1. A radiation-sensitive mixture which is suitable for preparing a polyimide, a polyisoindoloquinazolinedione, a polyoxazinedione, a polyquinazolinedione or a polyquinazolone and which on irradiation with actinic light undergoes solubility differentiation, conprising of
   (a) one or more precursors having structural elements of the general formula (I)

$$\overset{...\;C-A}{\underset{\overset{\|}{O}}{}}\overset{Q}{\underset{}{}}\overset{C-B^1-R^2-B^2-R^1}{\underset{\overset{\|}{O}}{}}$$
$$R^1-B^2-R^2-B^1-\underset{\overset{\|}{O}}{C}\qquad A-\underset{\overset{\|}{O}}{C}-NH-R^3-NH... \qquad (I)$$

where,

A is —O—, —NH— or a single bond,

Q is an aromatic tetravalent radical, or a radical which contains two bivalent aromatic radicals linked by a bridging group, wherein two at a time of the valences are adjacent to each other, $B^1$ is —O—, or —$NR^4$—, $B^2$ is —NH—CO—NH—, —NH—CO—O—, —N-H—CO—or a single bond, $R^1$ is a readily hydrogen-donating radical, $R^2$ is a bivalent aliphatic or aromatic radical or a single bond, $R^3$ is a bivalent aliphatic, cycloaliphatic, aromatic or heterocyclic radical which may be halogen-substituted and $R^4$ is H or straight-chain or branched alkyl which may be halogen-substituted, with the proviso that the readily hydrogen-donating radical $R^1$ is a radical selected from the group consisting of isoalkyls, aminoisoalkyls, and groups of the following general formulae:

[structural formulae shown]

where
n=2 or 3 and
$R^5$ is alkyl, aryl, halogen-substituted alkyl or halogen-substituted aryl, (b) one or more aryl-containing carbonyl compounds which when excited by UV radiation are capable of hydrogen abstraction, and optionally
   (c) one or more substances selected from the group consisting of a photoinitiator, a photosensitizer, a (leuco)dye and an aliphatic ketone.

2. A radiation-sensitive mixture as claimed in claim 1, wherein the aryl-containing carbonyl compound (b) used comprises one or more aromatic ketones from the group consisting of benzophenone, xanthone, thioxanthone, fluorenone, benzil, acenaphthenequinone, tetralone, benzylideneacetone, dibenzylideneacetophenone, benzoin, benzoin ether, benzanilide, acetophenone, propiophenone, naphthoquinone, anthraquinone, anthrone, 2-, 3- and 4-hydroxybenzophenone, benzophenone-2-carboxylic acid, benzophenone-3-carboxylicacid, benzophenone-4-carboxylic acid ,3,3',4,4'-benzophenonetetracarboxylic acid and anhydride, 3,3,'4,4'-tetra(tert -butylperoxycarbonyl)-benzophenone, 2-, 3-, and 4-phenylbenzophenone, 2-, 3- and 4-alkylbenzophenones having from 1 to 10 carbon atoms in the alkyl radical, halogenated (monoalkyl)benzophenone and 4-(trifluoromethyl)benzophenone.

3. A radiation-sensitive mixture as claimed in claim 1, wherein carbonyl compound (b) comprises heteroceriumdianthrone, its endoperoxide, a ketone from a group consisting of 2-acetonaphthone, 4-aminobenzophenone, Michler's ketone and the salts of these amines.

4. A radiation-sensitive mixture as claimed in claim 1, wherein carb-onyl compound (b) is used in an amount of from 0.001 to 200% by weight, based on precursor (a).

5. A radiation-sensitive mixture as claimed in claim 1, wherein precursor (a) has been obtained by linking a carboxyl-containing polyaddition product of an aromatic or heterocyclic tetracarboxylic anhydride and a diamino compound at the carboxyl groups to radicals $R^1$ via an ester, ether, amide or urethane group.

6. A radiation-sensitive mixture as claimed in claim 1, wherein precursor (a) has been obtained by linking carboxyl-containing polyaddition product of an aromatic or heterocyclic dihydroxydicarboxylic acid and diisocyanate at the carboxyl groups to radicals $R^1$ via an ester, ether amide or urethane group.

7. A radiation-sensitive mixture as claimed in claim 1, wherein precursor (a) has been obtained by linking a carboxyl-containing polyaddition product of an aromatic or heterocyclic diaminodicarboxylic acid and a diisocyanate at the carboxyl groups to radicals $R^1$ via an ester, ether, amide or urethane group.

8. A radiation-sensitive mixture as claimed in claim 1, which contains a combination of different radicals $R^1$.

9. A radiation-sensitive mixture as claimed in claim 1, which contains in addition other radiation-sensitive mixtures or non-radiation-sensitive substances or mixtures of radiation-sensitive and non-radiation-sensitive substances.

10. The radiation-sensitive mixture of claim 1, where carbonyl compound (b) is in solid form.

11. The radiation-sensitive mixture of claim 1, wherein carbonyl compound (b) is in dissolved form.

12. The radiation-sensitive mixture of claim 1, wherein carbonyl compound (b) is in dispersed form.

13. The radiation-sensitive mixture of claim 1, wherein carbonyl compound (b) is in molten form.

14. The radiation-sensitive mixture of claim 1, wherein carbonyl compound (b) is in monomeric form.

15. The radiation-sensitive mixture of claim 1, wherein carbonyl compound (b) is in polymeric form.

* * * * *

UNITED STATES PATENT AND TRADEMARK OFFICE
CERTIFICATE OF CORRECTION

PATENT NO. : 5,087,550

DATED : Feb. 11, 1992

INVENTOR(S) : BLUM et al.

Page 1 of 2

It is certified that error appears in the above-identified patent and that said Letters Patent is hereby corrected as shown below:

On the title page,

Insert Foreign Application Priority Data --Oct. 1, 1988

(DE) Fed. Rep. of Germany......3833437--.

IN THE CLAIMS:

Claim 1, column 19, line 6, delete "conprising" and insert --comprising--.

column 19, between lines 50 and 54, the chemical structure  .

UNITED STATES PATENT AND TRADEMARK OFFICE
CERTIFICATE OF CORRECTION

PATENT NO. : 5,087,550

DATED : Feb. 11, 1992

INVENTOR(S) : Blum et al

It is certified that error appears in the above-identified patent and that said Letters Patent is hereby corrected as shown below:

column 19, between lines 64 and 67, the chemical structure "[structure]" should read "[structure]".

Claim 4, column 20, line 57, delete " carb-onyl" and insert --carbonyl--.

Signed and Sealed this

Twentieth Day of April, 1993

*Attest:*

MICHAEL K. KIRK

*Attesting Officer*      *Acting Commissioner of Patents and Trademarks*